United States Patent
Boecking et al.

(10) Patent No.: US 7,339,308 B2
(45) Date of Patent: Mar. 4, 2008

(54) ACTUATING UNIT FOR A PIEZO-ELECTRICALLY CONTROLLED FUEL INJECTION VALVE

(75) Inventors: Friedrich Boecking, Stuttgart (DE); Dieter Kienzler, Leonberg (DE); Dietmar Uhlmann, Korb (DE); Uwe Bruetsch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 48 days.

(21) Appl. No.: 10/553,419

(22) PCT Filed: Mar. 19, 2004

(86) PCT No.: PCT/DE2004/000569

§ 371 (c)(1),
(2), (4) Date: Oct. 17, 2005

(87) PCT Pub. No.: WO2004/097952

PCT Pub. Date: Nov. 11, 2004

(65) Prior Publication Data

US 2006/0284740 A1    Dec. 21, 2006

(30) Foreign Application Priority Data

May 2, 2003   (DE) ............................... 103 19 601

(51) Int. Cl.
*H01L 41/053*   (2006.01)
(52) U.S. Cl. ...................... 310/348; 310/328
(58) Field of Classification Search ................ 310/325, 310/328, 338, 340, 345, 346, 348, 367, 369, 310/360
See application file for complete search history.

(56) References Cited

U.S. PATENT DOCUMENTS

| | | | |
|---|---|---|---|
| 6,274,967 B1 * | 8/2001 | Zumstrull et al. | 310/328 |
| 6,681,462 B1 | 1/2004 | Frank et al. | |
| 6,800,987 B2 * | 10/2004 | Toda | 310/348 |
| 6,984,924 B1 * | 1/2006 | Voigt et al. | 310/348 |
| 6,998,761 B1 * | 2/2006 | Frank et al. | 310/328 |
| 2003/0168937 A1 * | 9/2003 | Heinz et al. | 310/328 |
| 2004/0169445 A1 * | 9/2004 | Freudenberg et al. | 310/354 |

FOREIGN PATENT DOCUMENTS

| | | | | |
|---|---|---|---|---|
| DE | 102 60 363 A1 | 7/2004 | | |
| DE | 103 10 787 A1 | 9/2004 | | |
| JP | 55-134990 | * 10/1981 | | 310/311 |
| JP | 64-81671 | * 3/1989 | | 310/369 |
| JP | 2-83987 | * 3/1990 | | 310/311 |
| JP | 3-112376 | * 5/1991 | | 310/369 |
| WO | WO 99/08330 A1 | 2/1999 | | |
| WO | WO 00/08353 A1 | 2/2000 | | |
| WO | WO 03/019688 A2 | 3/2003 | | |

\* cited by examiner

*Primary Examiner*—Thomas M. Dougherty
(74) *Attorney, Agent, or Firm*—Ronald E. Greigg (57) ABSTRACT

An actuator unit which is suitable for actuating a fuel injection valve of an injection system for internal combustion engines includes a piezoelectric actuator and a hollow body embodied as a spring. The service life of the actuator unit can be improved by designing the hollow body to eliminate or minimize bending stresses on the piezoelectric actuator.

31 Claims, 9 Drawing Sheets

ACTUATING UNIT FOR A PIEZO-ELECTRICALLY CONTROLLED FUEL INJECTION VALVE

CROSS-REFERENCE TO RELATED APPLICATIONS

This application is a 35 USC 371 application of PCT/DE 2004/000569 filed on Mar. 19, 2004.

BACKGROUND OF THE INVENTION

1. Field of the Invention

The invention relates to an improved actuator unit comprising a piezoelectric actuator.

2. Description of the Prior Art

Actuator units of the type with which this invention is concerned are used, among other ways, in fuel injection systems and particularly in fuel injection valves, since the switching times of such actuator units are very fast. The short switching times allow more-exact dimensioning of the injected fuel quantity and enable improved shaping of the course of the injection over time. The overall term "fuel injection valve" is understood in conjunction with the invention to mean all types of fuel injection valves, such as injectors for common rail injection systems or injection nozzles of conventional fuel injection systems. A fuel injection valve with a piezoelectric actuator is actuated by subjecting the piezoelectric actuator to an electrical voltage, and as a result the piezoelectric actuator, because of known physical effects of the piezoceramic, expands rapidly and lifts the valve closing member from a valve seat. The piezoelectric actuator has a certain mass, which is accelerated. If the voltage applied to the actuator is reduced, the actuator has the tendency to contract. Because of the mass inertia of the previously accelerated mass of the actuator, the result, depending on the triggering speed, is tensile forces in the actuator, which cause damage to the piezoelectric actuator, especially cracks in the soldered connections between individual layers of the piezoelectric actuator. To avoid such damage, the procedure has changed to prestressing the piezoelectric actuator in the axial direction by means of a cylindrical hollow body embodied as a spring. One such arrangement is known, for instance from International Patent Disclosure WO 00/08353 (Siemens). This hollow body is bent from a flat metal sheet and is welded at the first seam thus created. The first seam extends parallel to the longitudinal axis of the hollow body.

Welding the first seam has the following disadvantages, among others: The welding causes what as a rule is an unwanted alteration in the microstructure of the hollow body in the immediate vicinity of the weld seam. A second problem is the splashes that occur during welding, which can cause difficulties in assembling the actuator unit or even lead to functional failures of the fuel injection valve, if one or more such splashes come loose during operation. A third problem is the subsidence of the weld seam (seam drop) at the beginning and end of the weld seam, and the resultant notch effect and increase in stress.

SUMMARY AND ADVANTAGES OF THE INVENTION

In the actuator unit of the invention, having a piezoelectric actuator disposed in a hollow body, in which the hollow body is embodied elastically and prestressed the actuator, and the hollow body is provided with recesses and has a first seam, extending parallel to a longitudinal axis, it is provided according to the invention that at least on a first end of the hollow body, a second seam is provided, located diametrically opposite the first seam.

In the design of the hollow body according to the invention, it is possible to dispense with welding the first seam. This also dispenses with the problems caused by welding. Moreover, the production costs are reduced.

One disadvantage of actuator units with an open parting seam on the hollow body is that the spring stiffness of the hollow body in the axial direction is not constant over the circumference. As a rule, because of the recesses in the hollow body, the spring stiffness is reduced in the region of the parting seam. As a result, the upper cover plate and the lower cover plate are acted upon by lateral forces during operation of the actuator unit. This results in an unequal load on the piezoelectric actuator by unwanted forces and bending moments.

Because according to the invention a second seam located diametrically opposite the first seam is placed in the hollow body, the spring rate of the hollow body on the side diametrically opposite the first seam is also reduced. As a result, the prestressing force introduced into the piezoelectric actuator by the upper cover plate and the lower cover plate acts precisely in the direction of the longitudinal axis of the piezoelectric actuator. Such loads are highly favorable for the piezoelectric actuator, and hence the service life of the actuator units equipped with a hollow body according to the invention can be increased markedly.

The advantages of the invention can be increased still further if a second seam, located diametrically opposite the first seam, is also provided on a second end of the hollow body. Alternatively, the second seam can extend from the first end to the second end of the hollow body. In other words, in this exemplary embodiment, the hollow body comprises two half-shells of equal size, which surround the piezoelectric actuator. The half-shells of this hollow body are also very favorable from a manufacturing standpoint.

Alternatively, it is also possible to introduce recesses into the hollow body on its ends, specifically opposite the first seam. As a result, the spring rate of the hollow body is purposefully reduced at this point as well, so that the spring rate of the hollow body is rotationally symmetrical, and thus the desired axial introduction of force is achieved.

For being able to introduce the prestressing force in the best possible way from the hollow body to the piezoelectric actuator, it is recommended that the hollow body is joined on its first end to an upper cover plate or to an adjusting disk, and the hollow body is joined on its second end to a lower cover plate or to a coupler housing. These connections can be made by welding or crimping, for instance.

If only a radial fixation of the hollow body is necessary, it can be done by means of an annular groove or a shoulder in the upper and/or lower cover plate, or in the adjusting disk and the coupler housing. This may be adequate, for instance whenever the hollow body is not stressed by tension but only by compression. An especially advantageous feature of these variant embodiments is that the hollow body is centered relative to the piezoelectric actuator or the hydraulic coupler by the annular groove and the shoulder. This effect can be improved still further if the annular groove and shoulder are dimensioned such that they widen the hollow body slightly during assembly.

It has proved especially advantageous if the contacting of a piezoelectric actuator located in the hollow body is effected via the upper cover plate, and the upper cover plate is embodied in two parts, and a parting seam is present between the two parts of the upper cover plate.

As a result, the installation space required for the actuator unit and the number of components needed are reduced, and moreover, the contacting of the piezoelectric actuator, which must at least partly go along with the motions of the actuator, is also taken over by the upper cover plate. The result is simple, reliable electrical contacting of the piezoelectric actuator, which has the requisite elasticity. Moreover, by this provision, the heat produced in operation of the piezoelectric actuator is dissipated very well, which improves the operating safety and the service life of the piezoelectric actuator.

It has also proved advantageous if the first seam and the second seam open into the parting seam of the upper cover plate, so that the electrical separation of the two parts of the upper cover plate is not undone by the hollow body, which after all may be made for instance from spring steel.

In addition, the upper cover plate can be electrically insulated by means of an insulator, in particular a ceramic insulator.

To assure the mechanical hold of the two-part upper cover plate together, a securing clamp or securing part can additionally be provided, which holds the two-part upper cover plate together.

In a further augmentation of the invention, it may be provided that between the hollow body and the piezoelectric actuator, a flexible binding means, in particular plastic-bonded metal or a soft solder, is present.

The recesses in the hollow body may have the familiar dumbbell or bonelike shape and may extend transversely to a longitudinal axis of the hollow body. It is also advantageous if a plurality of recesses are located one behind the other in one plane; and that the plane forms a right angle with the longitudinal axis of the hollow body. It has also proved advantageous if there is an even number of recesses in one plane.

If a plurality of planes are provided with recesses, it is recommended the planes extend parallel to one another, and the recesses of two adjacent planes are offset from one another. It is especially advantageous if the offset of the recesses of two adjacent planes is equal to half the repeat of the recesses in one plane. The term "repeat" will be explained at length hereinafter, in conjunction with FIG. 3.

Preferably, the hollow body has a cross section in the form of a circle or of a regular polygon.

The hollow body of the invention may also be employed in actuator units in which the piezoelectric actuator is disposed in the hollow body; and that the piezoelectric actuator is stressed for pressure by the prestressed hollow body. This means that the hollow body itself is stressed by tension.

However, the hollow body of the invention can also be used in actuator units in which the piezoelectric actuator is disposed outside the hollow body; and that the piezoelectric actuator is stressed for pressure by the prestressed hollow body. In that case, as a rule, the hollow body is stressed in compression.

According to the invention, it may furthermore be provided that the hollow body, on its first end and/or on its second end, has a region that is not perforated with recesses. As a result, the spring force transmitted from the hollow body to a cover plate or some other component of the injector is evened out, since the hollow body is purposefully reinforced in the region of its ends. This means that the maximum values for the spring force decrease over the circumference of the hollow body, and the problems of transverse forces introduced into the piezoelectric actuator from the hollow body are made even less severe.

BRIEF DESCRIPTION OF THE DRAWINGS

Other features and advantages of the invention will become apparent from the detailed description contained herein below, taken in conjunction with the drawings. in which.

DESCRIPTION OF THE PREFERRED EMBODIMENTS

Figure 1:
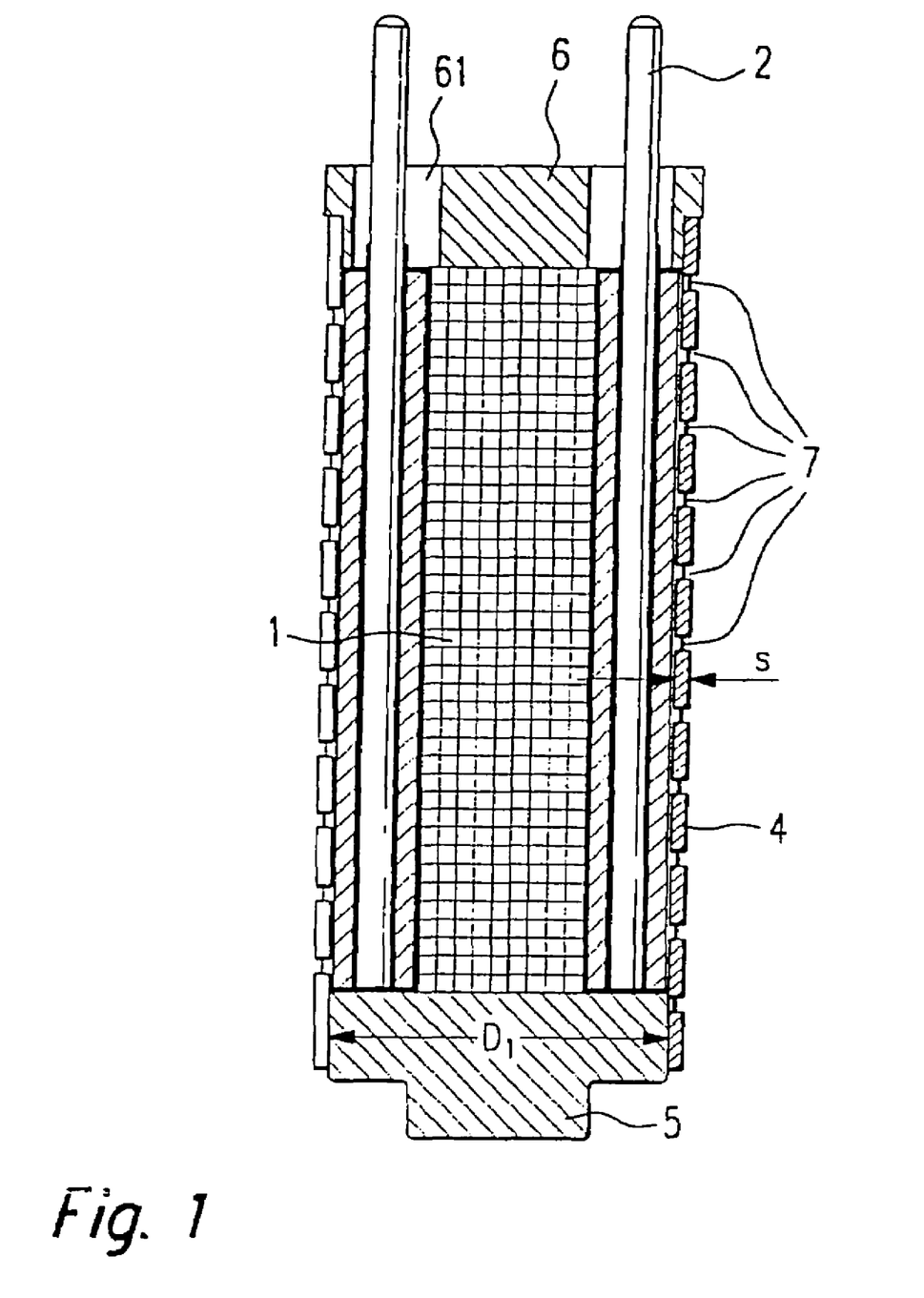
FIG. 1 is an elevation view, in section, of a first exemplary embodiment of an actuator unit of the invention.

In FIG. 1, a first exemplary embodiment of an actuator unit of the invention is shown in which actuator unit comprises a piezoelectric actuator 1, which may be constructed of a plurality of individual piezoelectric elements (not shown) stacked one above the other. The piezoelectric actuator 1 is triggered via contact pins 2, which are disposed along the actuator 1 and are electrically conductively connected to the actuator 1. By applying a voltage between the contact pins 2, a longitudinal expansion of the piezoelectric actuator 1 is generated, which is used for instance for controlling an injection valve in an internal combustion engine. The piezoelectric actuator 1 with the contact pins 2 is disposed in a hollow body 4 embodied as a tubular spring. The piezoelectric actuator 1 rests with each of its end faces on a respective cover plate 5 and 6; the upper cover plate 6 has ducts 61, through which the contact pins 2 extend. The upper and lower cover plates 5, 6 are each joined to the hollow body 4 in form-and/or force-locking fashion, preferably by welding. The weld seams in the upper and lower cover plates 5, 6 and in the hollow body 4 are not shown in FIG. 1. Alternatively, the connection between the hollow body and the two cover plates 5, 6 may for instance be done with the aid of crimping, in which the crimped-over upper and lower peripheral regions of the hollow body 4 each engage the cover plates 5, 6 from inside (not shown).

The piezoelectric actuator 1 is stressed by pressure with a prestressing force by means of the hollow body 4 and the cover plates 5, 6. In other words, the hollow body 4, before being welded to the upper and lower cover plates 5, 6, is prestressed and then welded.

The hollow body 4 is preferably made from spring steel. To enable establishing a desired spring rate for a given wall thickness "s", many apertures or recesses 7 are made in the hollow body 4. For the sake of simplicity, not all the recesses have been identified with reference numerals in FIG. 1.

Since the many recesses 7 can be best produced by punching, the hollow body 4 is as a rule made from sheet metal. From this sheet, first a flat blank or sheet with the recesses 7 punched out is formed. Next, the flat sheet is bent, until it has a circular cross section, for instance, or a cross section in the form of a regular polygon. Where the two ends of the bent flat sheet meet one another, a first seam (not shown in FIG. 1) is created.

Figure 2:
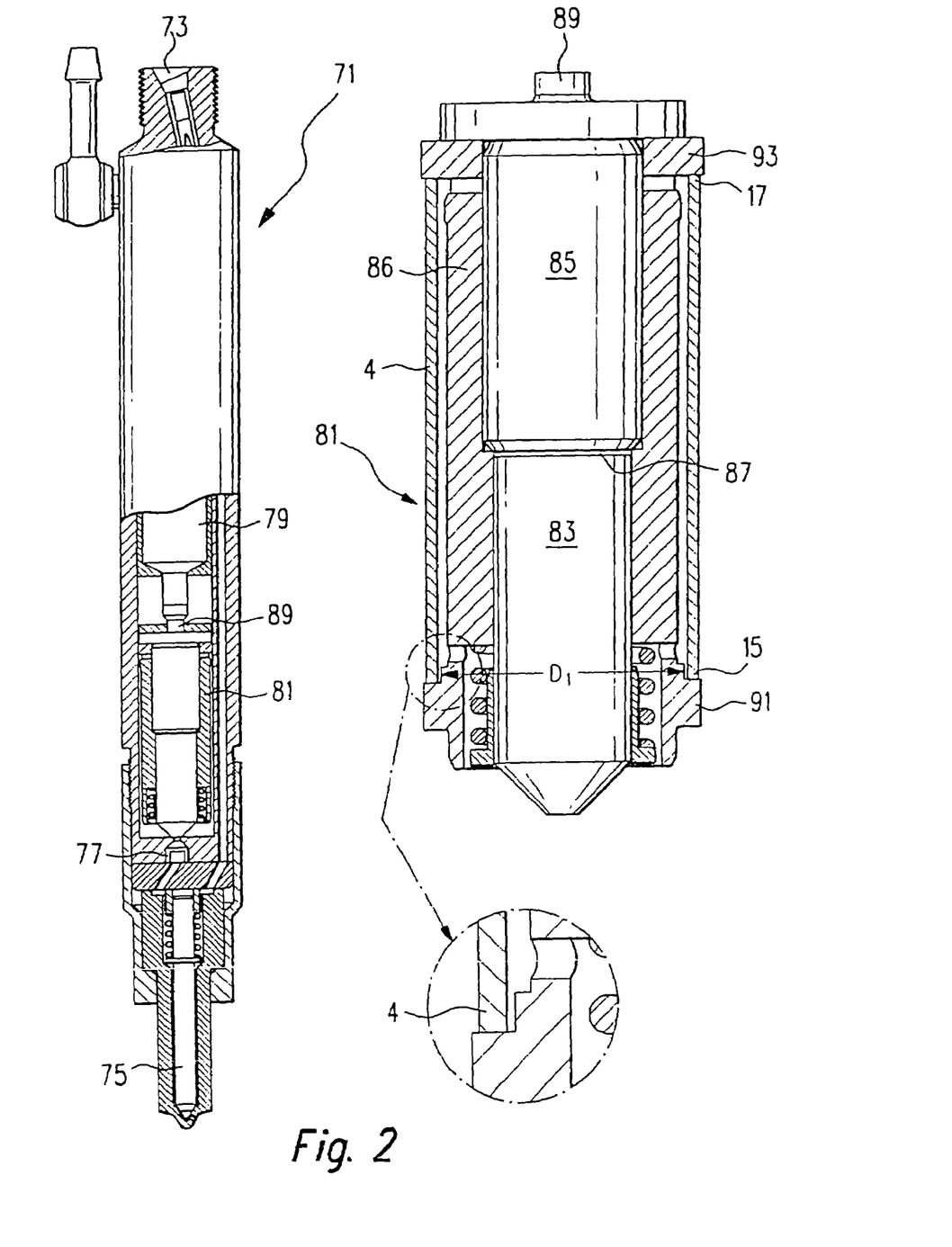
FIG. 2 shows a second exemplary embodiment of an actuator unit of the invention.

In FIG. 2, a second exemplary embodiment of an actuator unit of the invention is shown, which is integrated with a piezoelectrically actuated injector 71.

Since the present invention substantially pertains to an actuator unit and a hollow body 4 belonging to it, the injector 17 will not be described in all its details; essentially only the binding of the actuator unit to the injector 71 will be described. The other functionalities of the injector 71 are already familiar to one skilled in the field of injection technology and therefore require no further explanation.

The injector 71 has a high-pressure connection 73. Via the high-pressure connection 73, the injector 71 is supplied with fuel (not shown) that is at high pressure. If an injection into the combustion chamber (not shown) of an internal combustion engine is to be done, a nozzle needle 75 lifts from its seat, not shown, and uncovers injection ports, also not shown. The nozzle needle 75 is controlled via a control valve 77, which is actuated via a piezoelectric actuator 79. Located between the piezoelectric actuator 79 and the control valve 77 is a hydraulic coupler 81, which is shown enlarged on the right-hand side of FIG. 2.

The hydraulic coupler 81 substantially comprises a valve piston 83 and a booster piston 85, which are guided in a coupler housing 86. Between the valve piston 83 and the booster piston 85, there is a coupler gap 87, which is filled with fuel (not shown). This coupler gap 87 is necessary, among other reasons, because the coefficients of thermal expansion of the piezoelectric actuator 79 and of the metal component of the injector 71 differ greatly.

With its valve piston 83, the hydraulic coupler 81 actuates the control valve 77, while the booster piston 85 rests with a protrusion 89 on the piezoelectric actuator 79. Via a hollow body 4 of the invention that is prestressed in compression, the booster piston 85 is pressed against the piezoelectric actuator 79, thus subjecting this piezoelectric actuator to compressive prestressing. In the process, the hollow body is braced by its first end 15 against a shoulder 91 of the coupler housing 86. By its second end 17, the hollow body 4 is braced against an adjusting disk 93. Via the adjusting disk 93, the spring force of the hollow body 4 is transmitted to the protrusion 89 of the booster piston 85 and thus to the piezoelectric actuator 79.

So that the hollow body 4 is concentric with the hydraulic coupler 81 and thus also concentric with the piezoelectric actuator 79, the diameter $D_1$ of the shoulder 91 is adapted to the inside diameter of the hollow body 4 in such a way that the hollow body 4 is widened slightly when it is slipped onto the shoulder 91. Since the hollow body 4 of the invention has a first seam 31 that extends over the entire length of the hollow body, the hollow body 4 can be relatively easily widened far enough that it fits onto the shoulder 91.

If, as in the exemplary embodiment of FIG. 2, the hollow body 4 is acted upon by a compressive prestressing, it suffices if the hollow body can be braced in the axial direction on its ends 17 and 15. To further improve the radial fixation of the hollow body 4, an annular groove (not shown) may alternatively or additionally be provided in the shoulder 91 and/or in the adjusting disk 93.

Figure 3:
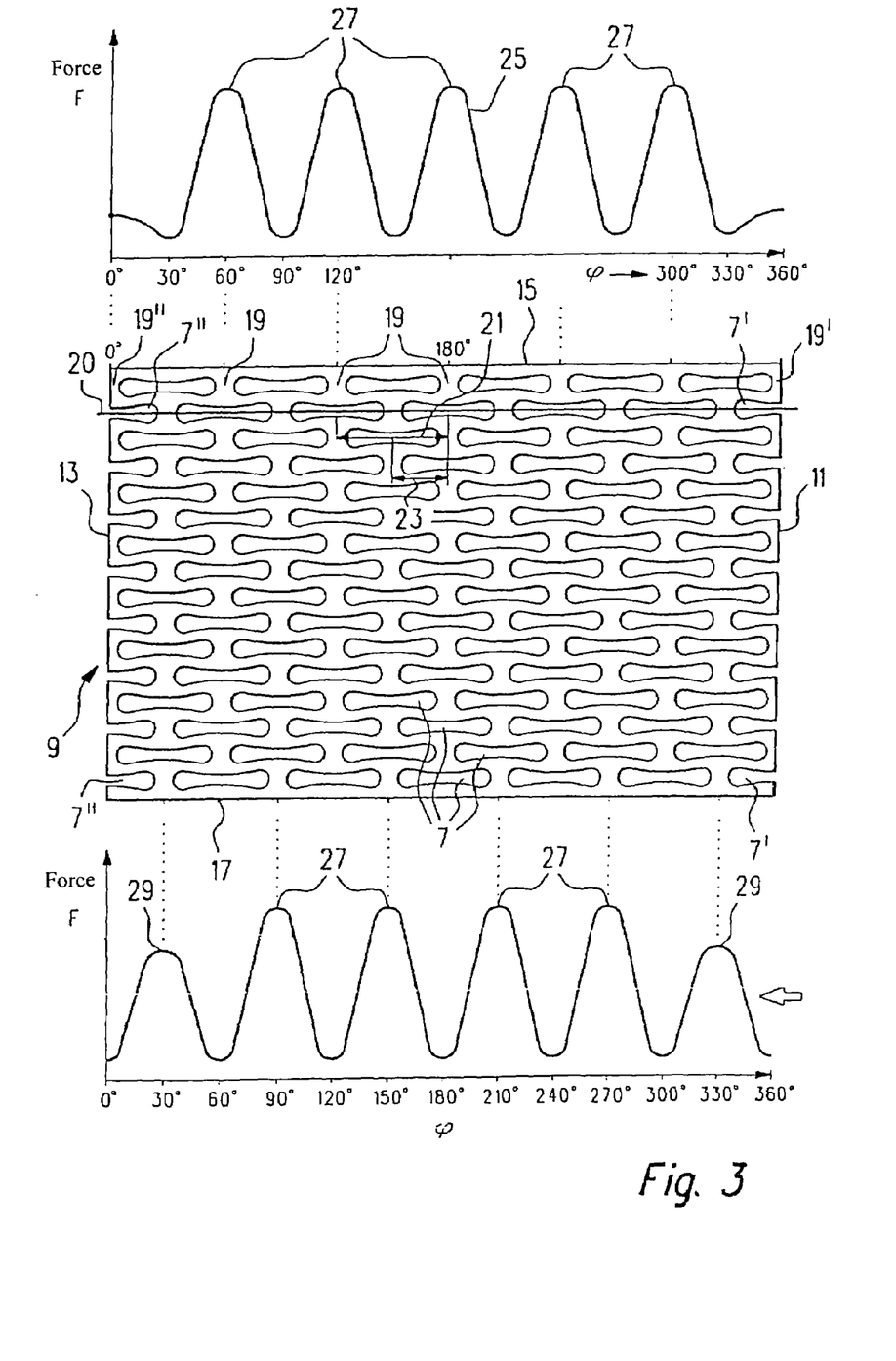
FIG. 3 shows one example of a flat sheet from which a hollow body is formed by bending.

In FIG. 3, a flat sheet 9 is shown, from which a hollow body 4 of the invention can be coiled. Many recesses 7 are punched out of the flat sheet 9. For the sake of simplicity, not all the recesses 7 that have a bonelike shape in the exemplary embodiment shown in FIG. 3 have been identified by reference numerals. The flat sheet 9 is rectangular, and two opposed edges 11 and 13 of the flat sheet 9 may be interrupted by the recesses 7, while the diametrically opposed ends or edges 15 and 17 have a straight course and are not interrupted by the recesses 7.

Figure 4:
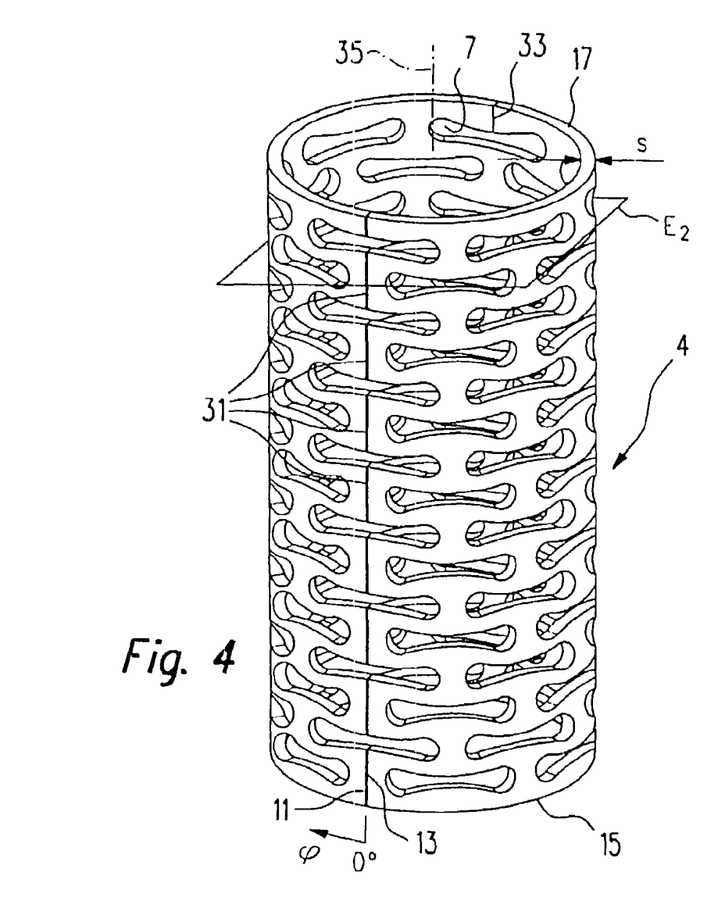
FIG. 4 is a first exemplary embodiment of a hollow body in a perspective view, with an even number of rows (in this case 16) in the longitudinal direction.

The flat sheet 9 is coiled up into a cylindrical or polygonal hollow body in such a way that the edges 15 and 17 form the first end 15 and second end 17 of the hollow body 4 (see FIG. 4). That is, the longitudinal axis 35, of the hollow body 4 extends parallel to the edges 11 and 13.

When the flat sheet 9 is bent as described above into a cylinder or polygon, the edges 11 and 13 touch and form a first seam 31 (see FIGS. 4 and 5), which extends parallel to the longitudinal axis 35 of the hollow body 4.

A plurality of recesses 7 are always located one after the other in rows in the flat sheet 9 and are separated by webs 19 between the recesses. For the webs 19 as well, no attempt has been made to identify all the webs of the flat sheet 9 with reference numerals, for the sake of simplicity. When the flat sheet 9 is bent into a hollow body in the way described above, the recesses 7 located one behind the other, i.e. those located in a row before bending, are located in a common plane. For instance, in FIG. 3, one row of recesses 7 that are located one behind the other is indicated by a line 20. In the exemplary embodiment of a flat sheet 9 shown in FIG. 3, 16 rows, each of six recesses 7, are located between the edge 15 and the edge 17.

As seen from FIG. 3, the recesses 7 of adjacent rows are offset relative to one another. The offset is selected such that it amounts to half the length of one recess 7 and one web 19. This amount is represented as an example in FIG. 3 by the double arrow 21 for one recess and two half webs 19. This amount is also called the "repeat". The offset between the recesses 7 of two adjacent rows of recesses is designated by reference numeral 23 in FIG. 3.

When the flat sheet 9 is rolled up to make a hollow body 4 (see FIG. 4 or FIG. 5), and this hollow body 4, at its face ends, is subjected to a compressive force via an upper cover plate 5 (see FIGS. 1 and 8) and the lower cover plate 6 (see FIGS. 1 and 8), then the force F acting between the upper cover plate 5 and the edge 15 over the circumference of the hollow body 4 has the course represented qualitatively by the line 25. The circumferential angle φ begins at the edge 13 at 0° and ends at the edge 11 at 360°.

It has been demonstrated that wherever a web 19 "braces" the edge 15, a major force F, represented by the maximum values 27 along the line 25, can be transmitted. The sole exception is where the edges 11 and 13 meet. There, the "cut-through" recess 7, with its parts 7' and 7", weakens the structured of the flat sheet, so that the force F transmitted at this point between the upper cover plate 5 and the hollow body 4 is less. This subject matter is represented in FIG. 3 by the markedly lesser value for the force F, at φ=0° and at φ=360°, compared to the maximum values 27.

The situation is similar at the edge 17. As seen in FIG. 3, in the immediate vicinity of the edge 17, at φ=0° and 360°, there is a cut-into recess, comprising the parts 7' and 7", while in the immediate vicinity of the edge 15, at φ=0° and 360°, there is a cut-apart web 19, which has the halves 19' and 19". The result is a somewhat different course of forces over the circumference of the edge 17.

As can be seen from the lower F-φ graph in FIG. 3, there are four maximum values there, and two further local maximum values 29 in the vicinity of the edges 11 and 13 at the angles φ=30° and 330°, which are markedly less than the maximum values 27.

Because of this unequal transmission of force over the circumference between the upper cover plate 6 and the edge 15, on the one hand, and between the lower cover plate 5 and the edge 17 on the other, a bending moment acting on the upper cover plate 6 and the lower cover plate 5 is generated by the hollow body 4 when the hollow body 4 is secured with prestressing to the upper and lower cover plates 6, 5. This bending moment is intrinsically transmitted to the piezoelectric actuator 1 as well, which has an unfavorable effect on its operating safety and service life. Moreover, this bending moment is unwanted at the hydraulic valve members that are actuated by the actuator unit.

In FIG. 4, a hollow body 4 that has been made from a flat sheet 9 shown in FIG. 3 is shown in perspective. The rows of recesses 7, not individually identified by reference numerals in FIG. 4, form 16 planes $E_1$ through $E_{16}$, which extend perpendicular to the longitudinal axis 35 of the hollow body 4. For the sake of illustration, one plane $E_2$ is symbolically shown in FIG. 4. The wall thickness s of the hollow body 4 is also shown in FIG. 4.

According to the invention, a second seam 33 is therefore provided at the edges 15 and 17, at the angle φ=180°. This second seam 33 will be described below in conjunction with FIG. 5. The hollow body 4 shown in these figures has been wound from the flat sheet 9 shown in FIG. 1. The edge 17 forms a first end of the hollow body 4, while the edge 15 forms a second end of the hollow body 4.

Figure 5:
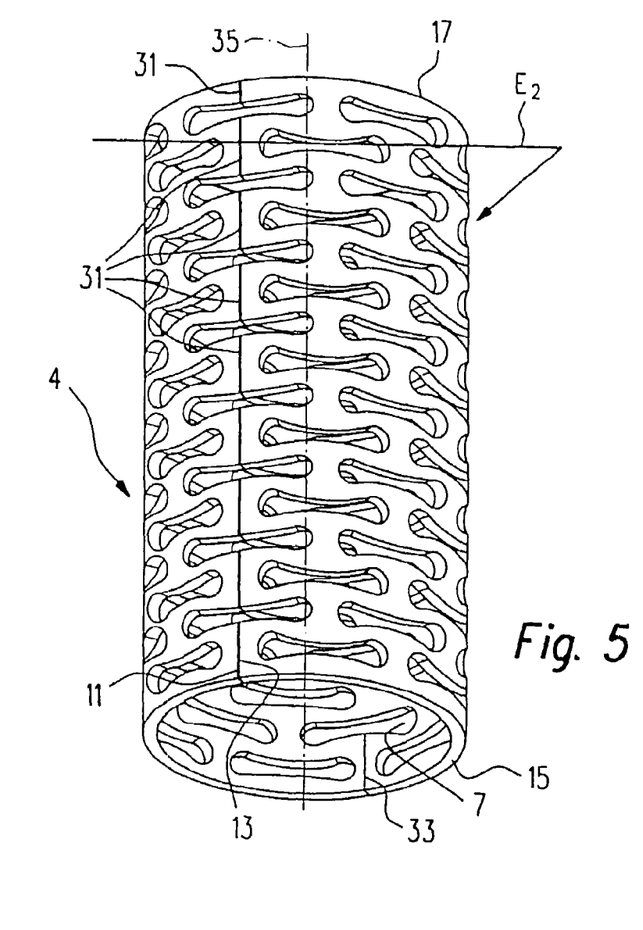
FIG. 5, the first exemplary embodiment of FIG. 4, from a different viewing angle.

In FIGS. 4 and 5, it can be clearly seen that the edges 11 and 13 of the flat sheet 9 (see FIG. 3) of the hollow body 4 are in opposed, abutting relation to one another. They are not welded together, so that the changes described in conjunction with FIG. 3 (transverse force, bending moment) in the axial direction of the hollow body 4 take place at the first seam 31 formed by the edges 11 and 13.

Figure 6:
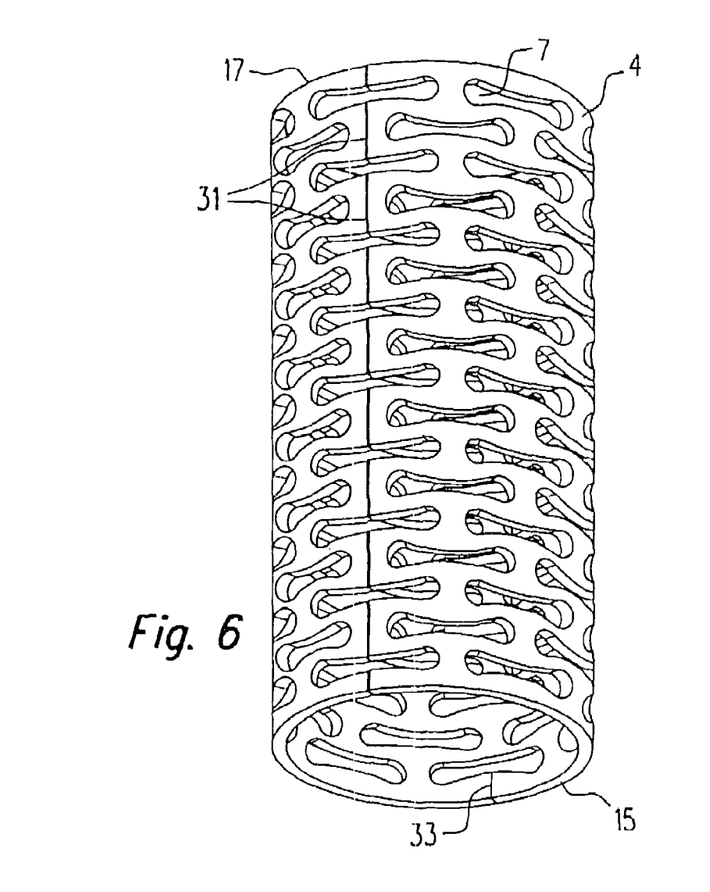
FIG. 6, a second exemplary embodiment of a hollow body of the invention, seen obliquely from below, with an odd number of rows (in this case, 17) of recesses in the longitudinal direction.

According to the invention, one or two second seams 33 (see FIGS. 5 and 6) are now provided in the hollow body 4, offset from the first seam 31 by 180°. The second seams 33, in the exemplary embodiments of FIGS. 5 and 6, are only long enough that they reach one recess 7. As a result, the hollow body 4 is likewise weakened at a circumferential angle φ of 180°, and the maximum value 27 at circumferential angle φ of 180° is decreased markedly. As a result, this provision means that the spring force exerted by the hollow body 4 on the piezoelectric actuator 1, 79 extends solely in the axial direction. Bending moments or forces in the radial direction are not introduced into the piezoelectric actuator 1, 79.

In FIG. 6, a second exemplary embodiment of a hollow body of the invention is shown. The essential distinction is that an odd number of rows of recesses 7, namely 17 rows, are provided. The termination of the first seam 31 is therefore the same at the edge 17 and at the edge 15. As a result, the force course is the same at both the edge 15 and the edge 17 and is equivalent to the force course shown in FIG. 3 in conjunction with the edge 17. Since the force course is symmetrical at the two ends 15 and 17 of the hollow body 4, the spring behavior of the hollow body 4 of the invention is further improved. The 17 rows of recesses 7, which are not individually designated by reference numeral in FIG. 6, form 17 planes $E_1$ through $E_{17}$, which extend perpendicular to the longitudinal axis of the hollow body 4.

Figure 7:
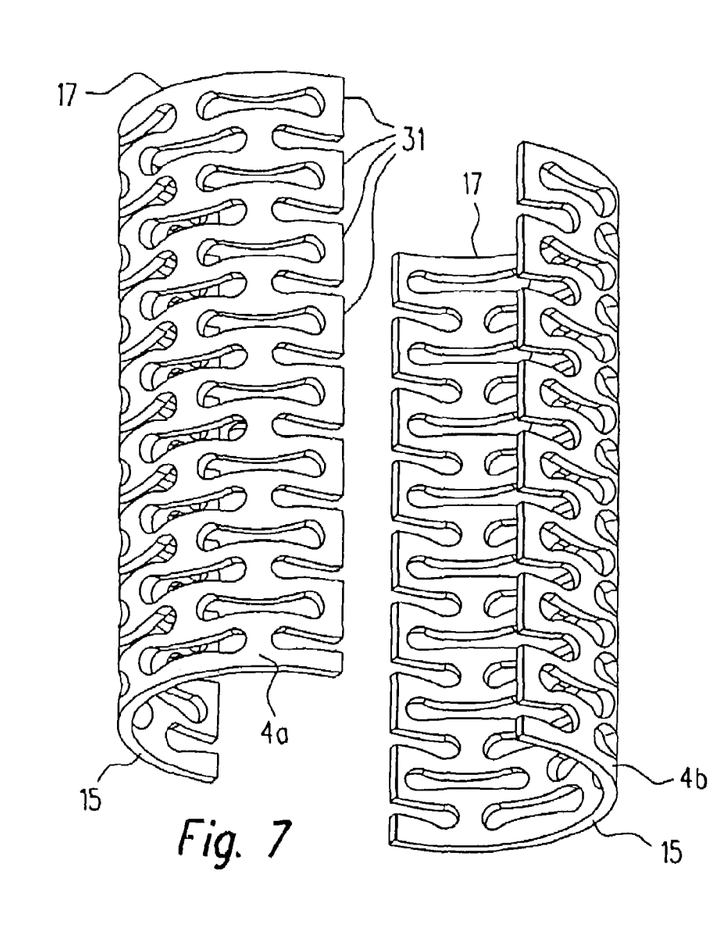
FIG. 7, a third exemplary embodiment of a hollow body of the invention, with an even number of rows (in this case, 16) of recesses in the longitudinal direction.

In the exemplary embodiment of FIG. 7, the second seam 33 extends from the edge 17 to the edge 15, so that the hollow body 4 comprises two cylindrical half-shells 4a and 4b. As a result, the force can be transmitted over the circumference between the edges 17 and 15 and the upper cover plate 6 and the lower cover plate 5 (not shown) is made still more uniform.

Figure 8:
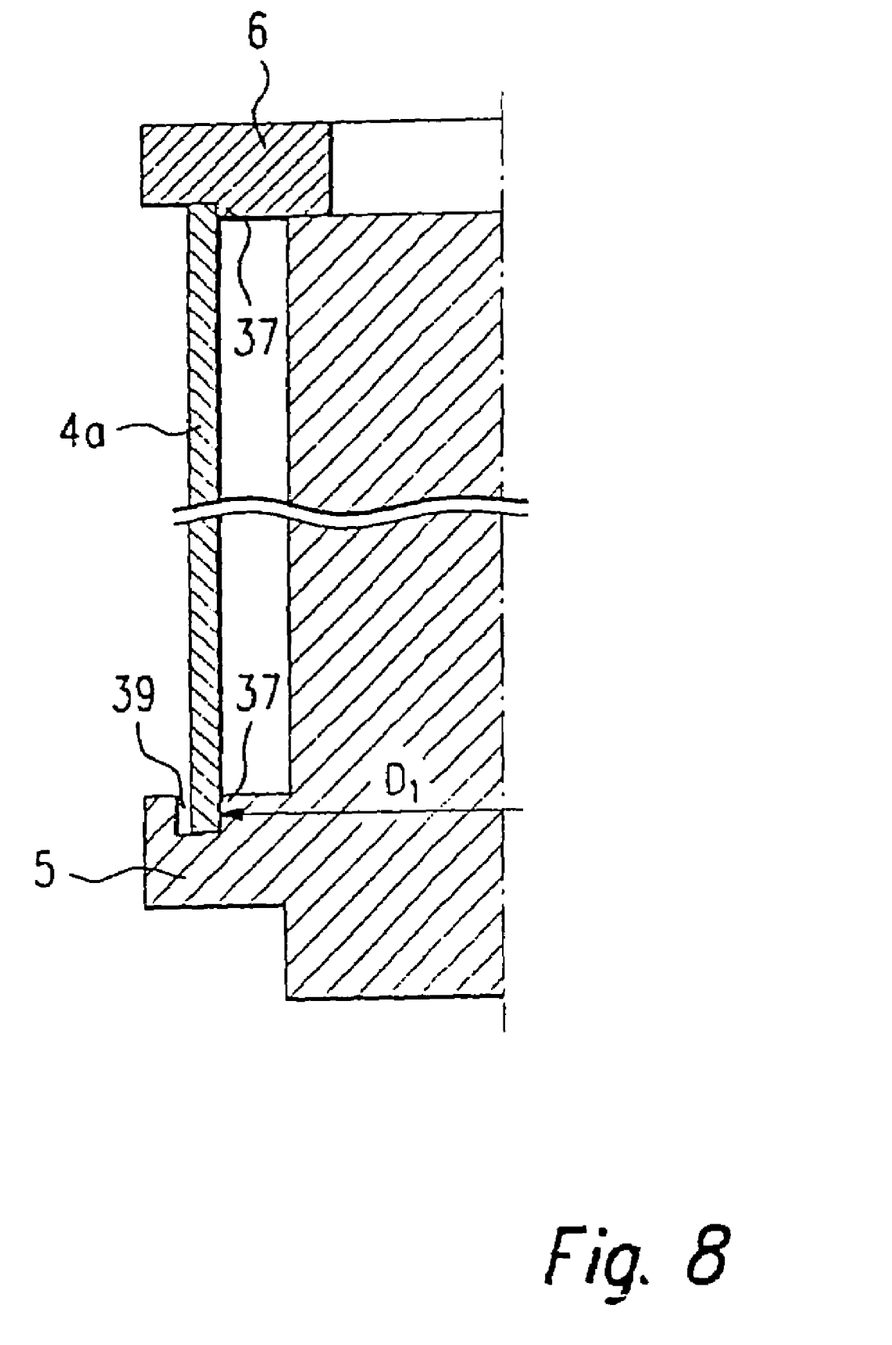
FIG. 8, one example for a radial fixation of the hollow body to the cover plates.

In FIG. 8, an actuator unit equipped with a hollow body as in FIG. 6 or FIG. 7 is shown, highly simplified, in fragmentary longitudinal section. So that the hollow body 4, of which only one half 4a is shown in section, is fixed in the radial direction, the upper cover plate 6 has a shoulder 37.

By means of this shoulder 37, the hollow body 4 is radially fixed. In the lower cover plate 5, an annular groove 39 is provided for the sake of radial fixation of the hollow body 4. It is understood that an annular groove (not shown) may also be provided in the upper cover plate 6. In the actuator unit shown in FIG. 8, not only two-part hollow bodies 4, but other hollow bodies of the invention, of the kind shown for instance in FIGS. 3 through 6, can be installed.

Figure 9:
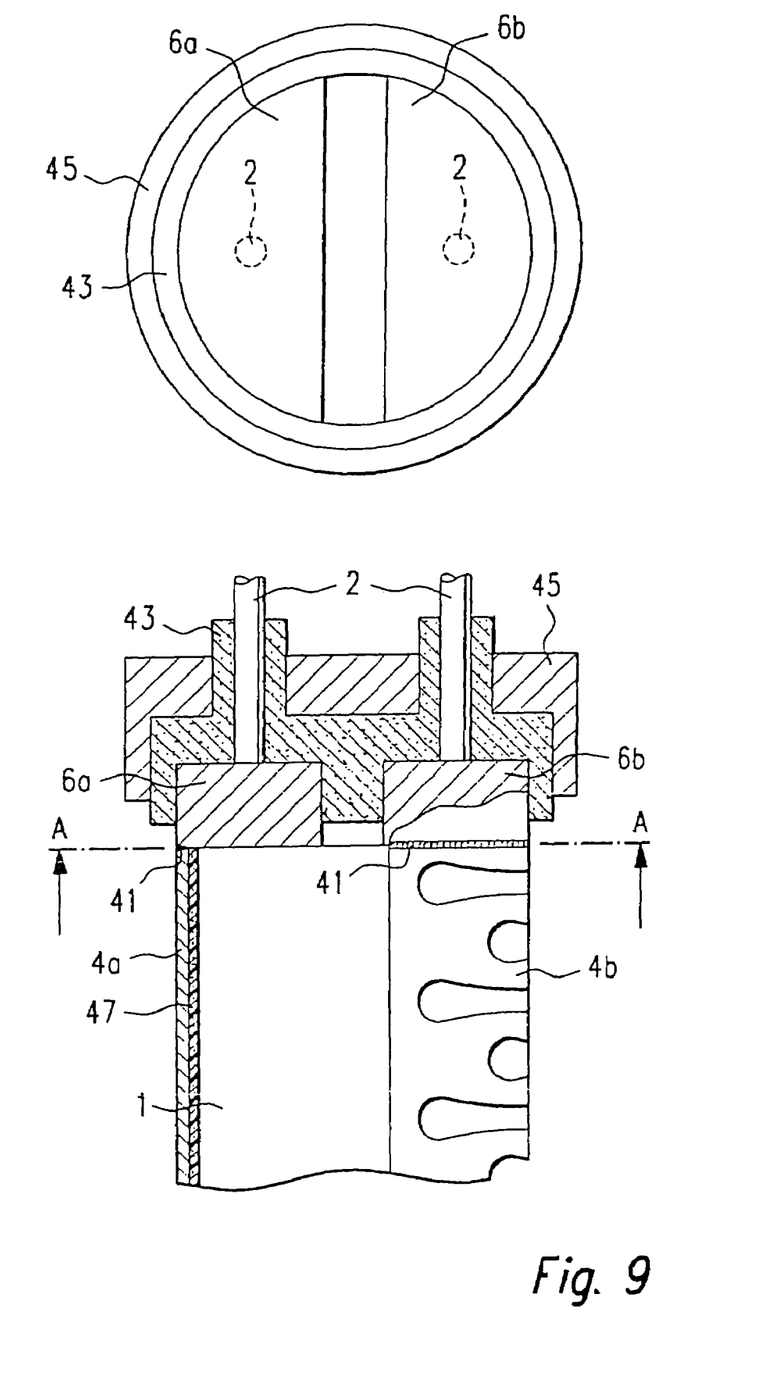
FIG. 9, a further exemplary embodiment of an actuator unit of the invention in both a fragmentary longitudinal section and in a transverse sectional view.

In FIG. 9, a further exemplary embodiment of an actuator unit of the invention, which is equipped with a two-part hollow body 4, is shown both in fragmentary longitudinal section and in a view from above. In this exemplary embodiment, the upper cover plate 6 is also embodied in two parts. The two parts of the upper cover plate 6 are identified by reference numerals 6a and 6b in FIG. 9. Each of the two contact pins 2 is electrically conductively connected to a respective part 6a, 6b of the upper cover plate 6. Via the upper cover plate 6a and 6b, the actuator 1 is electrically connected. The details of the electrical connection between the actuator 1 and the parts 6a and 6b of the upper cover plate are not shown in FIG. 9. However, how such contacting will be done is familiar to one skilled in the field of construction and in the manufacture of electrical actuators. In the exemplary embodiment shown in FIG. 9, the part 4a of the hollow body 4 is welded to the part 6a of the upper cover plate, as represented by a stylized weld seam 41. The part 4b of the hollow body is likewise welded to the part 6b of the upper cover plate 6 by means of a weld seam 41. The weld seam 41 also takes on the task of radial fixation of the hollow body 4a, 4b.

Between the parts 6a and 6b of the upper cover plate, an insulator 43, which is preferably made from ceramic, is provided, in order to disconnect the contact pins 2 as well as the parts 6a and 6b of the upper cover plate 6 electrically from one another. A securing clamp 45 is also shown in the exemplary embodiment of FIG. 9 and assures the holding together of the insulator 43 as well as the parts 6a and 6b of the upper cover plate.

Between the hollow body 4a, 4b and the actuator 1, there is a flexible binding means 47, which is preferably of plastic-bonded metal or a soft solder.

In FIG. 9, the view shown in the upper portion of the figure is located along section A-A of the lower portion.

Figure 10A:
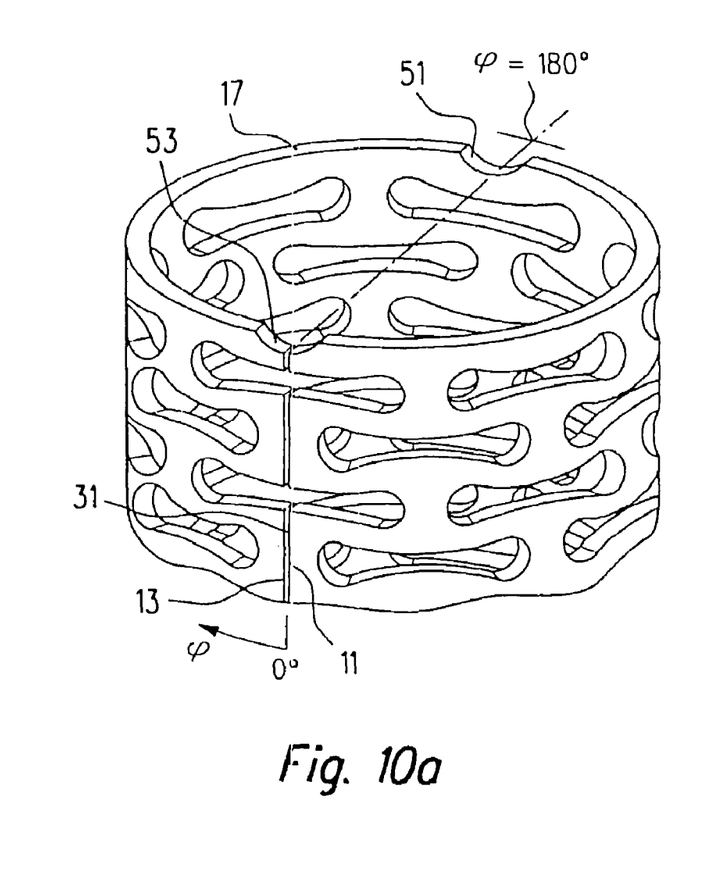
FIG. 10, a further exemplary embodiment of a hollow body of the invention.
Figure 10B:
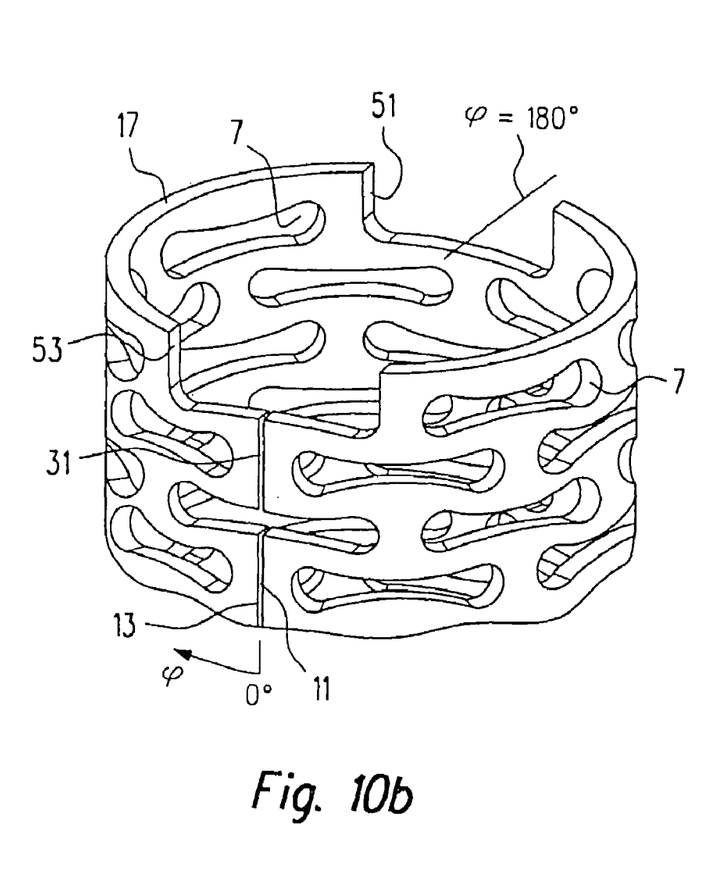

In FIGS. 10a and 10b, two further versions of hollow bodies 4 of the invention are shown in perspective. In these version, unlike the versions described above, an avoidance of the transverse force of the hollow body on the side diametrically opposite the first seam 31 (where φ is approximately equal to 180°) is achieved by providing a recess 51 there. The recess 51 results in a purposeful weakening of the hollow body 4 on the side diametrically opposite the first seam 31, 50 that as a result, the hollow body 4 exerts a force solely in the axial direction on the piezoelectric actuator 1, 79. The differences between the versions of FIGS. 10a and 10b are the shape of the recesses 51 and the location of the recesses 51 relative to the recesses 7. In the version of FIG. 10a, the recess 51 takes the form of a segment of a circle, while in the version of FIG. 10b the recess 51 is rectangular. The precise definition of the shape of the recesses 51 and of the dimensioning can readily be done for each particular application by one skilled in the art of FEM calculation.

In some cases, it has proved advantageous if recesses 53 are provided in the region of the first seam 31 as well.

The first ends 15 of the hollow body 4, not shown in FIGS. 10a and 10b, may be embodied identically to the second ends 17.

Figure 11:
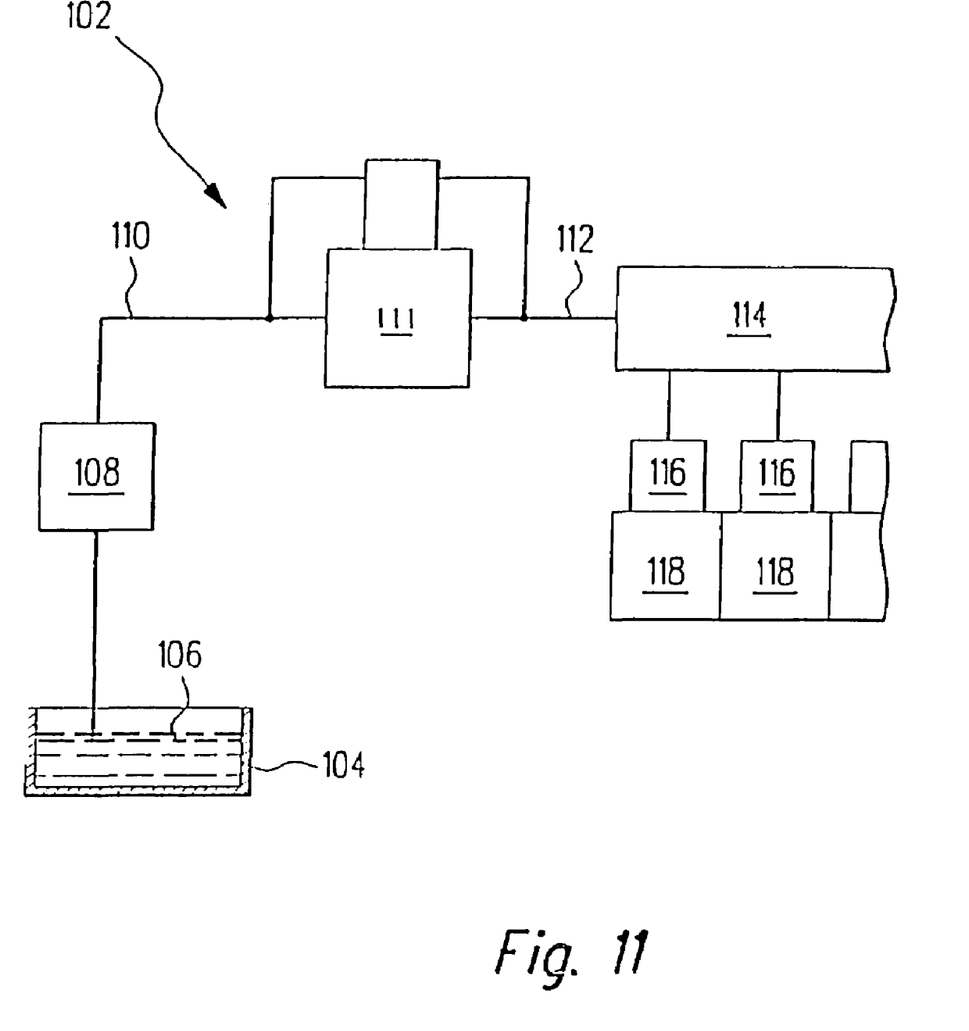
FIG. 11, a schematic illustration of a fuel injection system.

In conjunction with FIG. 11, it will now be explained how the fuel injection valve 116 of the invention is integrated into a fuel injection system 102 of an internal combustion engine.

The fuel injection system 102 includes a fuel tank 104, from which fuel 106 is pumped by an electric or mechanical fuel pump 108. Via a low-pressure fuel line 110, the fuel 106 is pumped to a high-pressure fuel pump 111. From the high-pressure fuel pump 111, via a high-pressure fuel line 112, the fuel 106 reaches a common rail 114. A plurality of fuel injection valves 116 are connected to the common rail and inject the fuel 106 directly into combustion chambers 118 of an internal combustion engine, not shown.

It is understood that each of the characteristics described in the specification, shown in the drawings, or recited in the claims may be essential to the invention either individually or in combination with other characteristics.

The foregoing relates to preferred exemplary embodiments of the invention, it being understood that other variants and embodiments thereof are possible within the spirit and scope of the invention, the latter being defined by the appended claims.

The invention claimed is:

1. An actuator unit, comprising
   a piezoelectric actuator (1) disposed in a hollow body (4), the hollow body (4) being embodied elastically and prestressing the actuator (1),
   a plurality of recesses (7) formed though the hollow body (4)
   a first seam (31) in the hollow body extending parallel to the longitudinal axis (35), of the hollow body, and
   at least one second seam (33) which is located diametrically opposite the first seam (31), and located selectively at one or both end portions of the hollow body but not medially thereof.

2. An actuator unit, comprising
   a piezoelectric actuator (1) disposed in a hollow body (4), the hollow body (4) being embodied elastically and prestressing the actuator (1),
   a plurality of recesses (7) formed through the hollow body (4),
   a first seam (31) in the hollow body extending parallel to the longitudinal axis (35) of the hollow body, and
   a first recess formed at least on a first end (17) of the hollow body (4) and located diametrically opposite the first seam (31).

3. The actuator unit of claim 2, further comprising a further recess (51), located diametrically opposite the first seam (31) and on a second end (15) of the hollow body (4).

4. The actuator unit of claim 2, wherein one recess (53) each is provided on the first end (17) and/or on the second end (15) of the hollow body (4), in the region of the first seam (31).

5. The actuator unit of claim 1, wherein the hollow body (4) is joined on its first end (17) to an upper cover plate (6) or to an adjusting disk (93).

6. The actuator unit of claim 2, wherein the hollow body (4) is joined on its first end (17) to an upper cover plate (6) or to an adjusting disk (93).

7. The actuator unit of claim 1, wherein the hollow body (4) is radially fixed on its first end (17).

8. The actuator unit of claim 2, wherein the hollow body (4) is radially fixed on its first end (17).

9. The actuator unit of claim 7, wherein the hollow body (4) is fixed radially on its first end (17) in the upper cover plate (6) in particular by means of an annular groove (39) or a shoulder (37).

10. The actuator unit of claim 7, wherein the hollow body (4) is fixed radially on its first end (17) in the adjusting disk (93) in particular by means of an annular groove (39) or a shoulder (37).

11. The actuator unit of claim 7, wherein the hollow body (4) is secured by its first end (17) to the upper cover plate (6) by welding (41).

12. The actuator unit of claim 2, wherein the contacting of a piezoelectric actuator (1) located in the hollow body (4) is effected via the upper cover plate (6).

13. The actuator unit of claim 2, wherein the upper cover plate (6) is embodied in two parts (6a, 6b); and wherein a parting seam is present between the two pans (6a, 6b).

14. The actuator unit of claim 13, wherein the first seam (31) and the second seam (33) open into the parting seam of the upper cover plate (6a, 6b).

15. The actuator unit of claim 12, further comprising a ceramic insulator (43) electrically insulating the upper cover plate (6, 6a, 6b).

16. The actuator unit of claim 12, further comprising a securing clamp (45) or a securing cup holding the upper cover plate (6, 6a, 6b) together.

17. The actuator unit of claim 12, further comprising a flexible, plastic-bonded metal or a soft solder binding mean between the hollow body (4) and the piezoelectric actuator (1).

18. The actuator unit of claim 1, wherein the hollow body (4) is radially fixed on its second end (15).

19. The actuator unit of claim 1 wherein the hollow body (4) is joined on its second end (15) to a lower cover plate (5) or to a coupler housing (86).

20. The actuator unit of claim 19, wherein the hollow body (4) is fixed radially on its second end (15) in the lower cover plate (5) or in the coupler housing (86), in particular by means of an annular groove (39) or a shoulder (91).

21. The actuator unit of claim 19, wherein the hollow body (4) is secured by its second end (15) to the lower cover plate (5) by welding (41).

22. The actuator unit of claim 1, wherein the recesses (7) are embodied in bonelike shape and extend transversely to the longitudinal axis (35) of the hollow body (4).

23. The actuator unit of claim 1, wherein a plurality of recesses (7) are located one behind the other in a plane ($E_2$); and wherein the plane ($E_2$) forms a right angle with the longitudinal axis (35) of the hollow body (4).

24. The actuator unit of claim 23, wherein there is an even number of recesses (7) in one plane ($E_2$).

25. The actuator unit of claim 23, wherein a plurality of planes ($E_i$) are provided with recesses (7); and that the planes ($E_i$) extend parallel to one another.

26. The actuator unit of claim 25, wherein the recesses (7) of two adjacent planes ($E_1$) are offset (23) from one another.

27. The actuator unit of claim 26, wherein the offset (23) of the recesses (7) of two adjacent planes is equal to half the repeat (21) of the recesses (7) in one plane ($E_1$).

28. The actuator unit of claim 1, wherein the hollow body (4) has a circular cross section.

29. The actuator unit of claim 1, wherein the cross section of the hollow body (4) has the form of a regular polygon.

30. The actuator unit of claim 1, wherein the piezoelectric actuator (1) is disposed in the hollow body (4); and wherein the piezoelectric actuator (1) is stressed in compression by the prestressed hollow body (4).

31. An actuator unit, comprising
   a piezoelectric actuator (1) disposed adjacent one end of a hollow body (4),
   the hollow body (4) being embodied elastically and being connected to the actuator so as to prestress the actuator (1), a plurality of recesses (7) formed through the hollow body (4)

a first seam (31) in the hollow body extending parallel to the longitudinal axis (35), of the hollow body and at least one second seam (33) at least on a first end (17) portion of the hollow body (4) and located diametrically opposite the first scam (31), wherein the piezoelectric actuator (1) is disposed outside the hollow body (4); and wherein the piezoelectric actuator (1) is stressed in compression by the prestressed hollow body (4).

* * * * *